United States Patent
Park et al.

(10) Patent No.: US 11,071,226 B2
(45) Date of Patent: Jul. 20, 2021

(54) CABLE HARNESS

(71) Applicant: Arista Networks, Inc., Santa Clara, CA (US)

(72) Inventors: Youngbae Park, Santa Clara, CA (US); Prasad Venugopal, Cupertino, CA (US); Hong Wang, Milpitas, CA (US)

(73) Assignee: Arista Networks, Inc., Santa Clara, CA (US)

( * ) Notice: Subject to any disclaimer, the term of this patent is extended or adjusted under 35 U.S.C. 154(b) by 0 days.

(21) Appl. No.: 16/554,337

(22) Filed: Aug. 28, 2019

(65) Prior Publication Data

US 2020/0077531 A1 Mar. 5, 2020

Related U.S. Application Data

(60) Provisional application No. 62/723,966, filed on Aug. 28, 2018.

(51) Int. Cl.
*H05K 7/02* (2006.01)
*H05K 7/04* (2006.01)
*H05K 7/06* (2006.01)
*H01B 7/00* (2006.01)

(52) U.S. Cl.
CPC ............ *H05K 7/06* (2013.01); *H01B 7/0045* (2013.01)

(58) Field of Classification Search
USPC .................................. 361/809, 807, 810
See application file for complete search history.

(56) References Cited

U.S. PATENT DOCUMENTS

| | | | | |
|---|---|---|---|---|
| 5,556,064 A * | 9/1996 | Cowe | ..................... | F16M 11/24 248/172 |
| 5,752,679 A * | 5/1998 | Thomason | ............... | H02G 1/14 248/165 |
| 6,883,670 B2 * | 4/2005 | Moon | ..................... | A47F 3/002 211/175 |
| 8,040,692 B2 * | 10/2011 | Hetzer | ..................... | H04Q 1/13 361/825 |
| 9,417,418 B2 * | 8/2016 | Eberle, Jr. | ............ | G02B 6/4471 |
| 2008/0175550 A1 * | 7/2008 | Coburn | ............... | G02B 6/3897 385/134 |
| 2011/0038589 A1 * | 2/2011 | Ruiz | ..................... | G02B 6/4441 385/135 |
| 2014/0002992 A1 * | 1/2014 | Claeys | ................... | H04Q 1/035 361/695 |

* cited by examiner

*Primary Examiner* — Hung S. Bui
(74) *Attorney, Agent, or Firm* — Fountainhead Law Group P.C.

(57) ABSTRACT

A cable harness includes a support frame configured to support a plurality of cables coupled to an electronic device. The cable harness also includes a tapered frame comprising a first end and a second end. The second end is smaller than the first end and the first end is coupled to the support frame. The cable harness further includes an attachment portion coupled to the tapered frame at the second end. The attachment portion is configured to attach the cable harness to the electronic device.

18 Claims, 12 Drawing Sheets

CABLE HARNESS

CROSS-REFERENCE TO RELATED APPLICATIONS

This application claims the benefit of U.S. Provisional Patent Application No. 62/723,966, filed on Aug. 28, 2018. The disclosure of the above-referenced application is hereby incorporated by reference in its entirety.

BACKGROUND

Electronic devices and/or computing devices may have various cables that may be coupled or connected to other devices. For example, a network module may include cables that may couple the network module to ports or connectors on other devices.

SUMMARY

In some implementations, an apparatus is provided. The apparatus includes a support frame configured to support a plurality of cables coupled to an electronic device. The apparatus also includes a tapered frame comprising a first end and a second end. The second end is smaller than the first end and the first end is coupled to the support frame. The apparatus further includes an attachment portion coupled to the tapered frame at the second end. The attachment portion is configured to attach the apparatus to the electronic device.

In some implementations, an apparatus is provided. The apparatus includes an electronic device and a cable harness. The cable harness is coupled to the electronic device. The cable harness includes a support frame configured to support a plurality of cables coupled to an electronic device. The cable harness also includes a tapered frame comprising a first end and a second end. The second end is smaller than the first end and the first end is coupled to the support frame. The cable harness further includes an attachment portion coupled to the tapered frame at the second end. The attachment portion is configured to attach the cable harness to the electronic device.

In some implementations, a method is provided. The method includes obtaining a first portion of a cable harness. The first portion of the cable harness includes a first portion of a support frame, a first portion of a tapered frame of an attachment portion. The method also includes obtaining a second portion of a cable harness. The second portion of the cable harness includes a second portion of a support frame, a second portion of a tapered frame of an attachment portion. The method further includes aligning the first portion of the support frame with the second portion of the support frame. The method further includes inserting a protrusion of the first portion of the support frame into a hollow portion of the second portion of the support frame.

In some implementations, a method is provided. The method includes attaching a cable harness to an electronic device comprising a plurality of cables. The cable harness includes a support frame configured to support a plurality of cables coupled to an electronic device, a tapered frame coupled to the support frame, and an attachment portion coupled to the tapered frame. The attachment portion is configured to attach the apparatus to the electronic device. The method also includes routing one or more cables of the plurality of cables through the support frame of the cable harness.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

DETAILED DESCRIPTION

As discussed above, electronic devices and/or computing devices may have various cables that may be coupled or connected to other devices. For example, a network module may include cables that may couple the network module to ports or connectors on other devices. The electronic devices often do not include components that allow a user to position or place the cables. For example, after a user couples a cable of an electronic device to another device, the cables may be left hanging out of an end or side of the electronic device. Users may be unable to organize the cables and to prevent the cables from tangling with each other. In addition, the electronic devices also do not provide components that allow a user to secure the cables to prevent the cables from moving, bending, flexing, etc., which may cause stress on portions of the cable. This stress may damage the cables and/or may degrade the performance of the cables.

Figure 1:
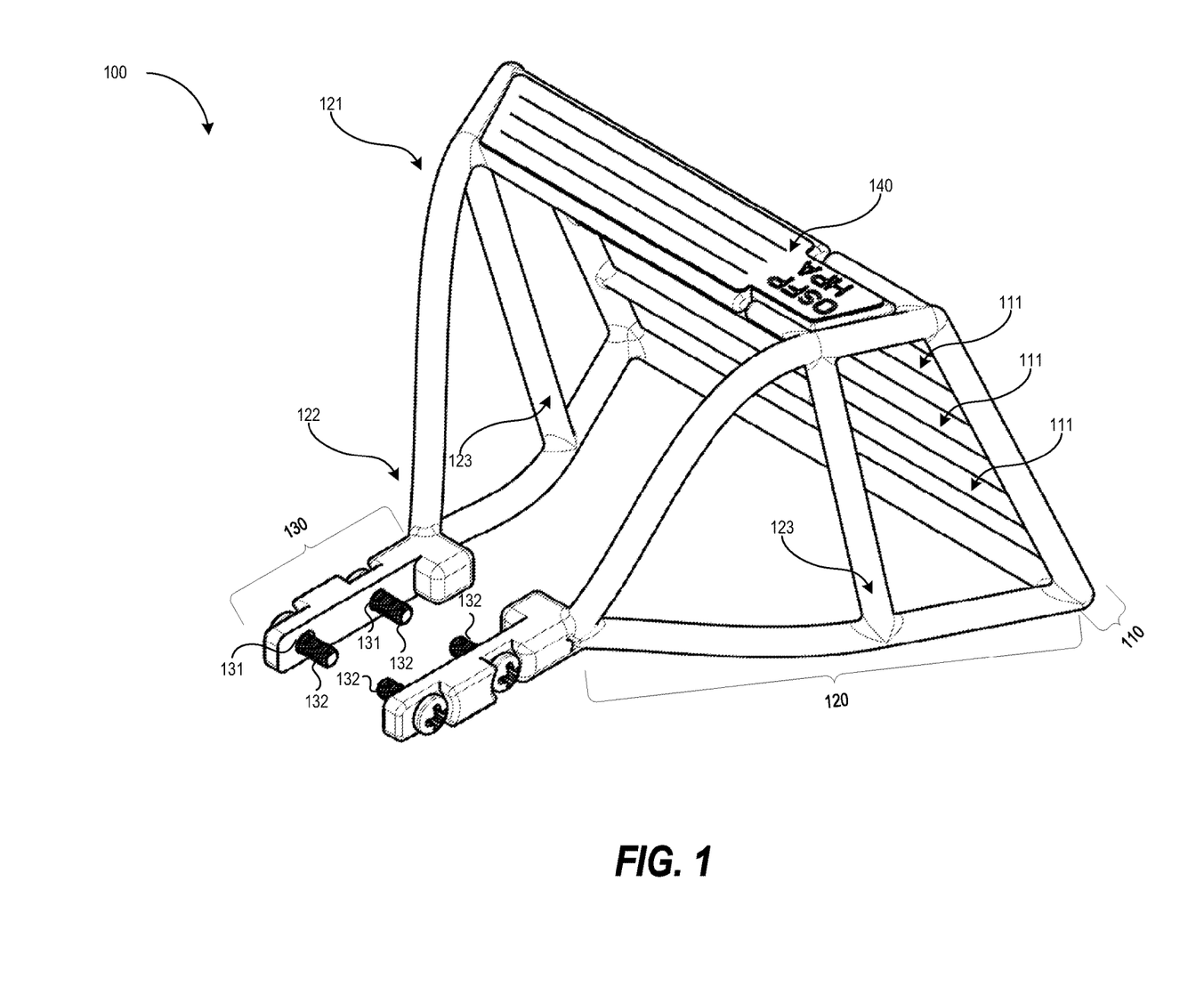
FIG. 1 illustrates a perspective view of a cable harness in accordance with one or more embodiments of the present disclosure.

FIG. 1 illustrates a perspective view of a cable harness 100 in accordance with one or more embodiments of the present disclosure. The cable harness 100 includes a support frame 110, a tapered frame 120, an attachment portion 130, and a labeling component 140. Although the present disclosure may refer to a support frame, a tapered frame, and an attachment portion, these may be different portions of a single frame or structure rather than separate frames or components. For example, the support frame may be a first portion of a single frame/structure, the tapered frame may be a second portion of the single frame/structure, and the attachment portion may be a third portion of the single frame/structure.

In one embodiment, the support frame 110 may support a plurality of cables (e.g., five cables, twenty cables, or any appropriate number of cables). The plurality of cables may be coupled to an electronic device (not illustrated in FIG. 1). For example, the plurality of cables may originate from or may be coupled to a network module, such as an octal small form factor pluggable (OSFP) module (e.g., a fiber optic network module). Although the present disclosure may refer to network modules (such as OSFP modules), the electronic device may be any type of electronic and/or computing device in other embodiments. Supporting the plurality of cables may help prevent damage to the cables (e.g., may help protect the cables), as discussed in more detail below.

In one embodiment, the support frame 110 may include a set of horizontal dividers 111 (e.g., one or more horizontal dividers 111). The horizontal dividers 111 may also be referred to as rails, bars, separators, etc. The horizontal dividers 111 may divide the plurality of cables into different sets or groups of cables. For example, the horizontal dividers 111 and the support frame 110 may form four levels (e.g., positions, elevations, heights, layers, planes, etc.) where cables may be positioned or placed. If there are sixteen cables coupled to or originating from the electronic device, the sixteen cables may be divided into four sets (e.g., groups) of four cables, one set of cables located in each of the of the four levels. Although three horizontal dividers 111 are illustrated in FIG. 1, any appropriate number of horizontal dividers 111 may be included in the support frame 110 in other embodiments.

In some embodiments, the horizontal dividers 111 may be used to organize the plurality of cables. For example, if the plurality of cables are also coupled to other electronic devices (e.g., the other ends of the plurality of cables are coupled to other electronic devices), the cables may be organized such that the cables which are connected to the same electronic device may be located in the same level. In other embodiments, the cables may be organized in the different levels in various different ways. For example, the each level may include cables with different thicknesses. In a further example, different types of cables may be located or positioned in different levels.

In one embodiment, the horizontal dividers 111 may support one or more of the plurality of cables. For example, portions of a cable (of the plurality of cables) may rest on one or more of the horizontal dividers 111. This may reduce the amount of stress on the portion of the cable by helping to prevent the cable from bending, curving, or flexing. The horizontal dividers 111 may also restrict the movement of the cables. For example, a cable may only move within the space of a level. This may also reduce the amount of stress or damage to a cable. In the first (e.g., top most level) level, the second level, and third level, the horizontal dividers 111 may support the cables. In the fourth level, the support frame 110 may support the cables.

In some embodiments (not illustrated in the figures), the support frame 110 may include vertical dividers (e.g., vertical rails, bars, separators, etc.). The vertical dividers may also divide the plurality of cables into multiple sets or groups of cables. For example, if one vertical divider is used to divide the support frame 110 into two halves (e.g., a left half and a right half), then some cables may be located/placed in the first half and other cables may be located/placed in the second half. The vertical rails may include openings (e.g., holes) which may allow the vertical rails to slide onto the support frame 110 and/or the dividers 111 when the cable harness 100 is assembled. The vertical dividers may also be used to organize the plurality of cables. For example, different types of cables may be placed in different portions of the support frame 110 which are defined by one or more vertical dividers. In other embodiments (not illustrated in the figures), the support frame 110 may include diagonal dividers (e.g., diagonal rails, bars, separators, etc.). The diagonal dividers may also divide the plurality of cables into multiple sets or groups of cables. The diagonal rails may include openings (e.g., holes) which may allow the diagonal rails to slide onto the support frame 110 and/or the dividers 111 when the cable harness 100 is assembled. The diagonal dividers may also be used to organize the plurality of cables. For example, different types of cables may be placed in different portions of the support frame 110 which are defined by one or more diagonal dividers.

The support frame 110 is coupled to the tapered frame 120. In one embodiment, the tapered frame 120 includes a first end 121 and a second end 122. The second end 122 is smaller than the first end. For example, the width of the second end 122 may be less than the width of the first end 121. In another example, the length of the second end 122 may be less than the width of the first end 121. The first end 121 may be positioned farther away from the electronic device than the second end 122, and vice versa.

Figure 7:
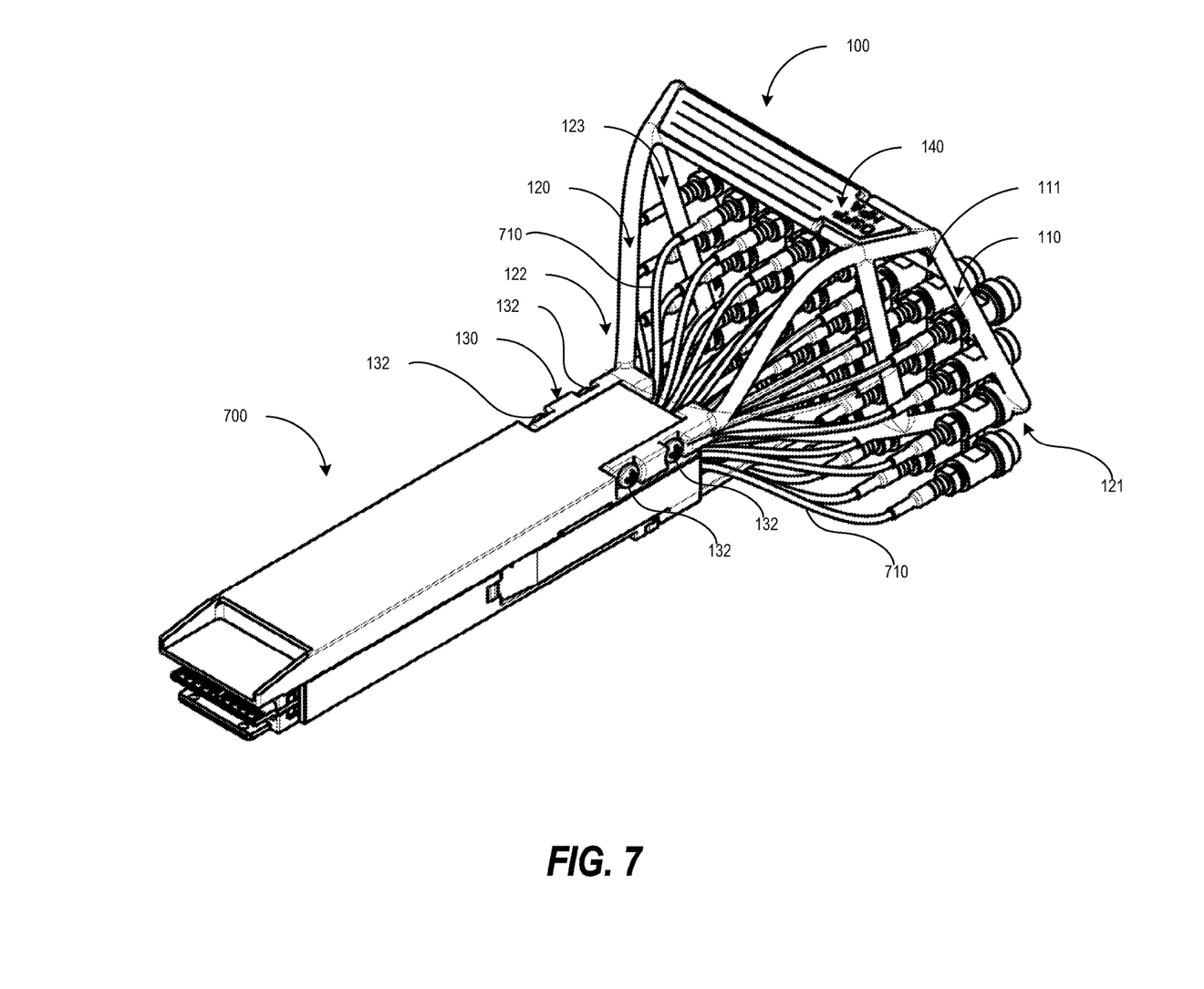
FIG. 7 illustrates a perspective view of a cable harness and an electronic device in accordance with one or more embodiments of the present disclosure.
Figure 8:
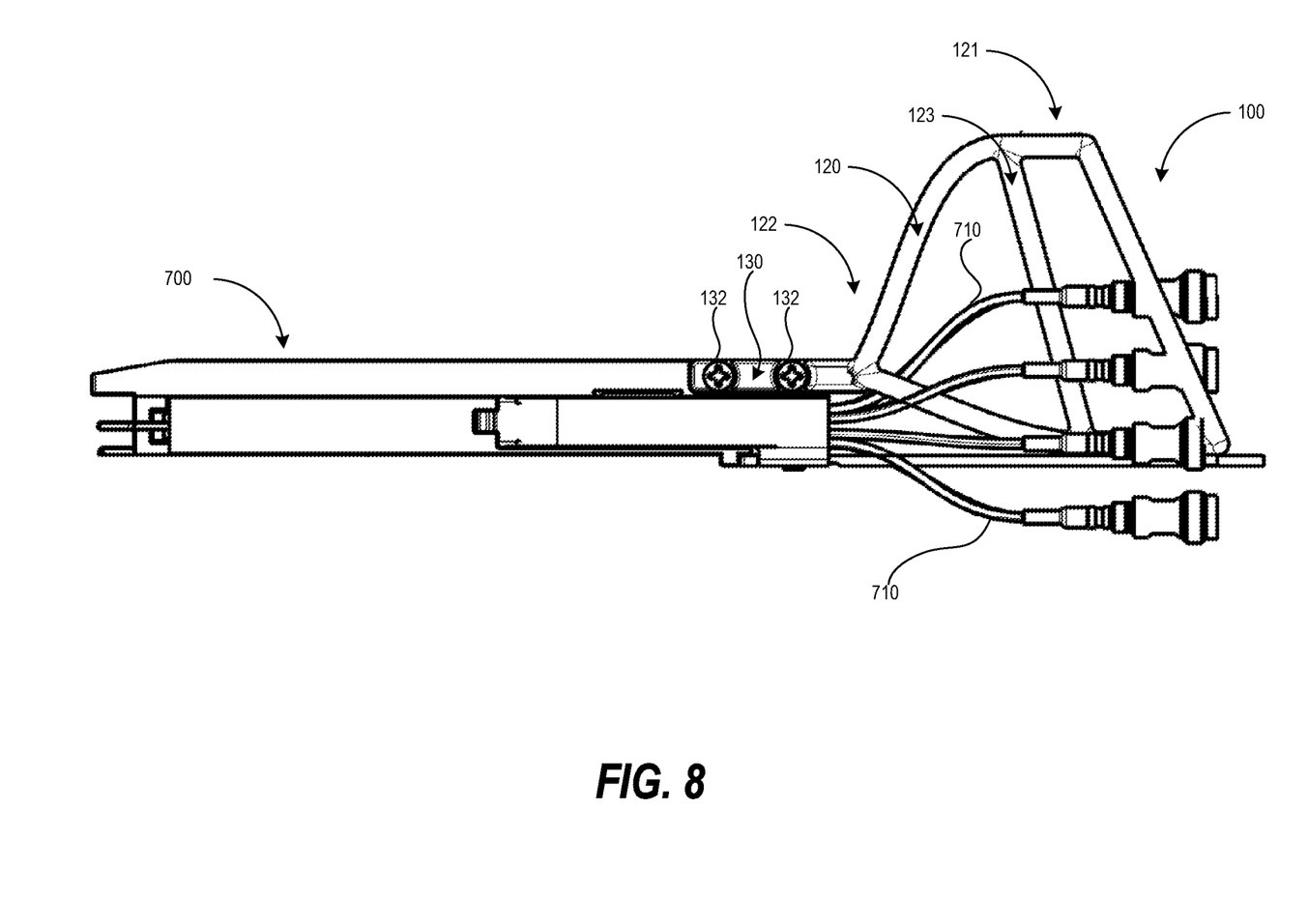
FIG. 8 illustrates a side view of a cable harness and an electronic device in accordance with one or more embodiments of the present disclosure.

In one embodiment, the tapered frame 120 may be used to direct the cables (originating from the electronic device) to the support frame 110. For example, the tapered frame 120 may keep the cables within the tapered frame 120 as the cables are placed or positioned into the different levels of the support frame 110. The support beams 123 may keep the cables within the tapered frame 120. The support beams 123 may also help the tapered frame 120 maintain its shape. For example, the support beams 123 may help prevent the tapered frame 120 from compressing or deforming in a vertical direction. The support beams 123 may also help support frame 110 to support the plurality of cables. For example, if the tapered frame 120 compresses or deforms, the support frame 110 may also compress or deform. The support beams 123 may help prevent the tapered frame 120 and the support frame 110 from compressing or deforming. The tapered frame 120 may also form or provide an intermediate open volume, space, region, etc. Portions of the cables may be located in the intermediate open volume, as illustrated in FIGS. 7 and 8.

In one embodiment, the tapered frame 120 may also help spread out the plurality of cables over a larger horizontal area/dimension. For example, the first end 121 of the tapered frame 120 may be wider (e.g., larger) than the second end 122. This may allow the cables which are placed in the support frame 110 to be spread out over a larger horizontal area/dimension. Spreading out the plurality of cables over a larger horizontal area/dimension may allow the plurality of cables to be accessed more easily. For example, spreading out the plurality of cables may allow a user to organize the cables more easily. In another example, spreading out the plurality of cables may help prevent the cables from getting tangled (e.g., may prevent the tangling of the cables).

The tapered frame 120 is coupled to an attachment portion 130. In one embodiment, the attachment portion 130 may be configured to attach the cable harness 100 to the electronic device (not illustrated in FIG. 1). For example, the attachment portion 130 may be configured to help secure the cable harness 100 to the electronic device to prevent the cable harness 100 from being separated from the electronic device.

In one embodiment, the attachment portion 130 may include openings 131 (e.g., holes, cavities, apertures, orifices, etc.). The openings 131 may align with additional openings on the electronic device. Pins 132 (e.g., a set of one or more pins) may interface with the openings 131 and the additional openings on the electronic device. For example, a screw, a bolt, a rod, etc., may be inserted through the openings 131 (e.g., a first set of openings) into the openings on the electronic device (e.g., a second set of openings). This may allow the cable harness 100 to be attached or secured to the electronic.

In one embodiment, the cable harness 100 may optionally include a labeling component 140. The labeling component 140 may allow a user to provide information about one or more of the plurality of cables and/or the electronic device. For example, the labelling component 140 may allow a user to write or print alphanumeric text that may identify the electronic device (e.g., an OSFP module). The labeling component 140 may be attached to the top of the cable harness 100 so that the labeling component 140 may be visible to a user. The labeling component 140 may be coupled to one or more of the support frame 110 and/or the tapered frame 120.

Figure 2:
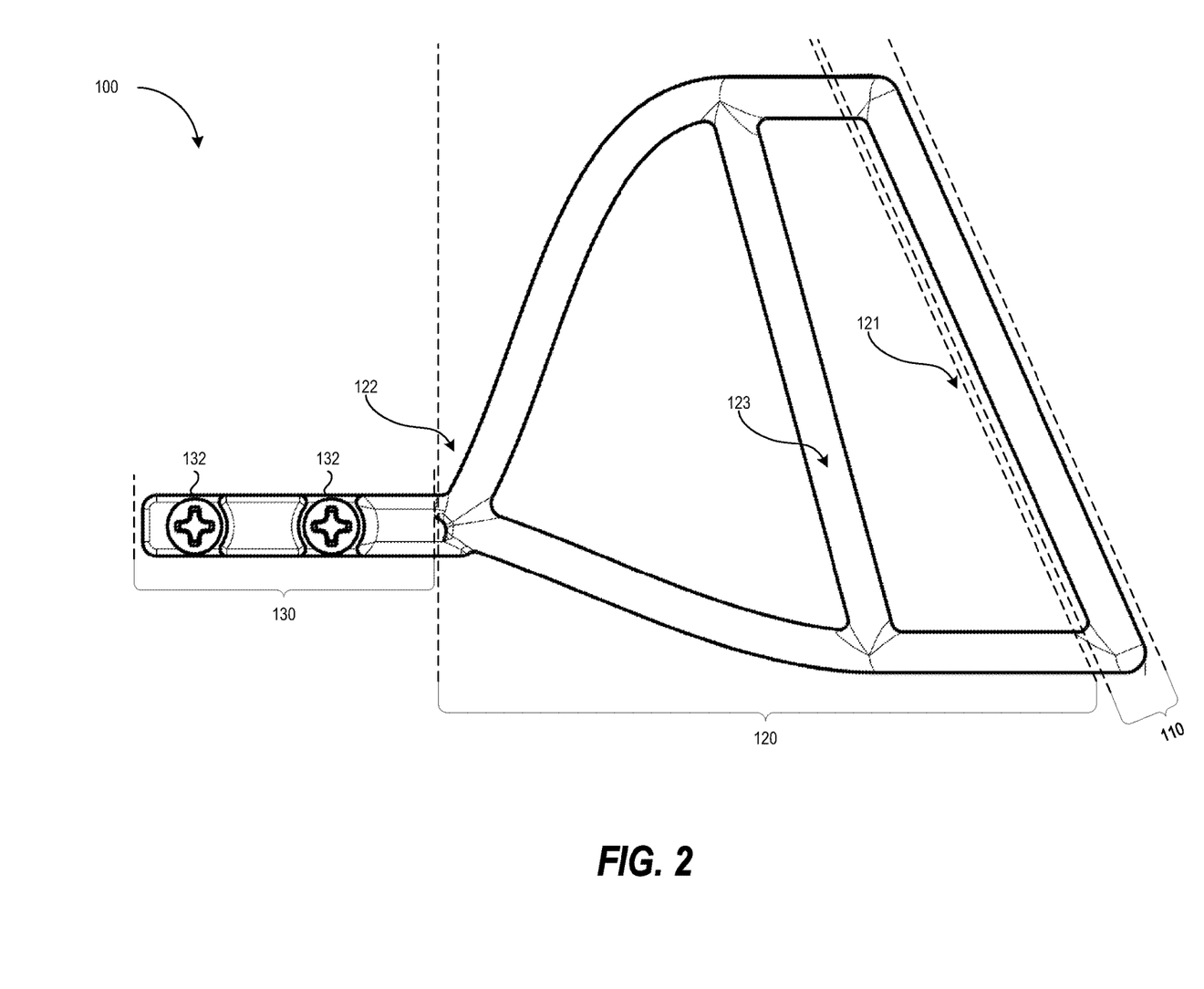
FIG. 2 illustrates a side view of a cable harness in accordance with one or more embodiments of the present disclosure.

FIG. 2 illustrates a side view of a cable harness 100 in accordance with one or more embodiments of the present disclosure. The cable harness 100 includes a support frame 110, a tapered frame 120, and an attachment portion 130. The support frame 110 is coupled to the tapered frame 120. The tapered frame 120 is coupled to the attachment portion 130.

In one embodiment, the support frame 110 may support a plurality of cables of a network device. In one embodiment, the support frame 110 may include a set of horizontal dividers, not illustrated in FIG. 2. The horizontal dividers may divide and/or support the plurality of cables into different sets or groups of cables, as discussed above. In one embodiment, the tapered frame 120 includes a first end 121 and a second end 122, as discussed above. The tapered frame 120 may be used to direct the cables to the support frame 110. The tapered frame 120 also includes support beams 123 which may keep the cables within the tapered frame 120 and may also help the tapered frame 120 maintain its shape. The tapered frame 120 may also help spread out the plurality of cables over a larger horizontal area/dimension. The tapered frame 120 may also form or provide an intermediate open volume, space, region, etc. Portions of the cables may be located in the intermediate open volume, as illustrated in FIGS. 7 and 8.

The attachment portion 130 may be configured to attach the cable harness 100 to the electronic device (not illustrated in FIG. 2), as discussed above. The attachment portion 130 may include openings (not illustrated in FIG. 2). The openings may align with additional openings on the electronic device. Pins 132 may interface with the openings of the attachment portion and the additional openings on the electronic device too secure or attach the cable harness 100 to the electronic device.

Figure 3:
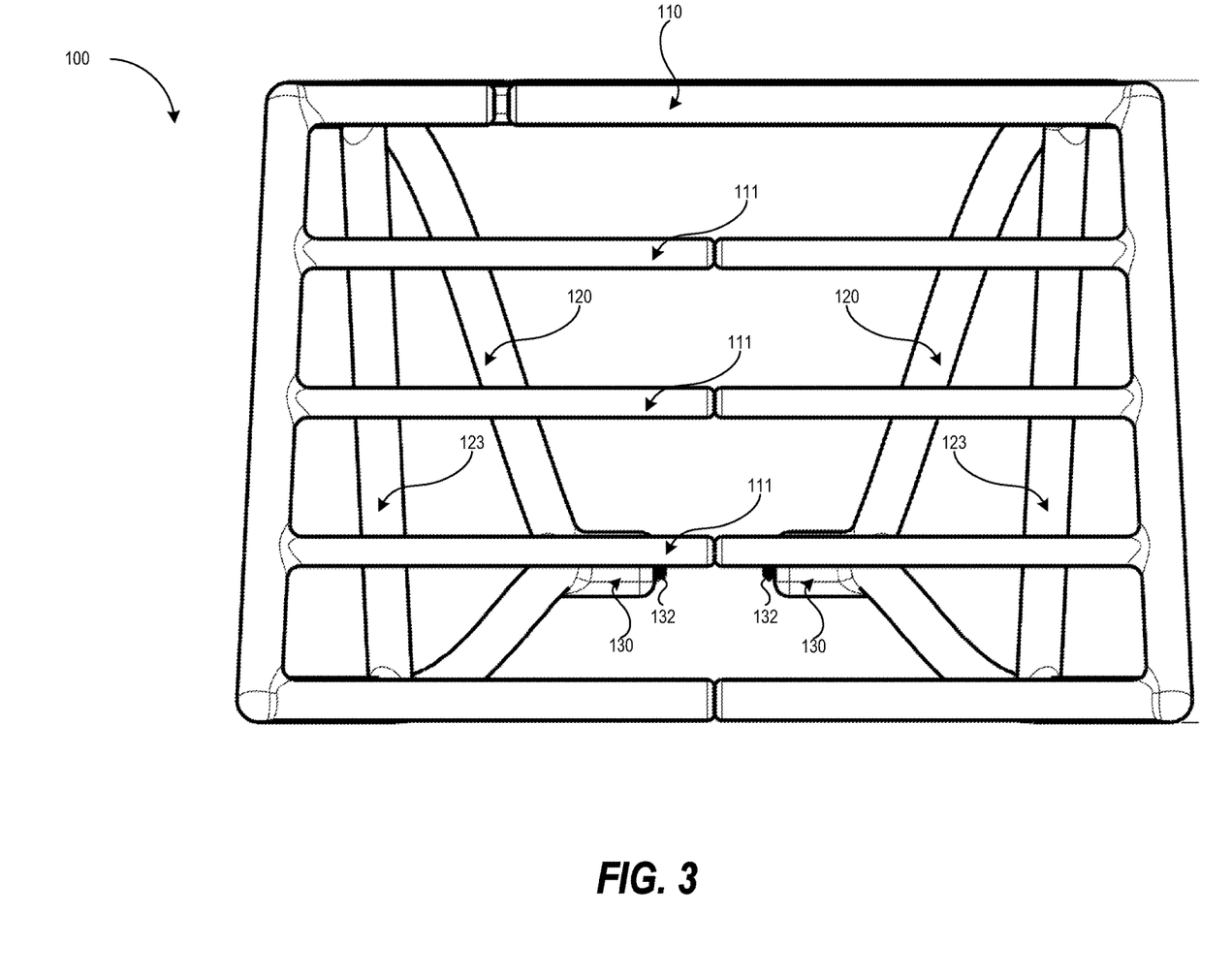
FIG. 3 illustrates a front view of a cable harness in accordance with one or more embodiments of the present disclosure.

FIG. 3 illustrates a front view of a cable harness 100 in accordance with one or more embodiments of the present disclosure. The cable harness 100 includes a support frame 110, a tapered frame 120, and an attachment portion 130. The support frame 110 is coupled to the tapered frame 120. The tapered frame 120 is coupled to the attachment portion 130.

In one embodiment, the support frame 110 may support a plurality of cables of a network device. In one embodiment, the support frame 110 may include a set of horizontal dividers 111. The horizontal dividers may divide and/or support the plurality of cables into different sets or groups of cables, as discussed above. The dividers 111 and the support frame 110 may form four levels for the cables, as discussed above. The tapered frame 120 includes a first end and a second end, as discussed above. The tapered frame 120 may be used to direct the cables to the support frame 110. The tapered frame 120 also includes support beams 123 which may keep the cables within the tapered frame 120 and may also help the tapered frame 120 maintain its shape. The tapered frame 120 may also help spread out the plurality of cables over a larger horizontal area/dimension. The tapered frame 120 may also form or provide an intermediate open volume, space, region, etc. Portions of the cables may be located in the intermediate open volume, as illustrated in FIGS. 7 and 8.

The attachment portion 130 may be configured to attach the cable harness 100 to the electronic device (not illustrated in FIG. 3), as discussed above. The attachment portion 130 may include openings (not illustrated in FIG. 3). The openings may align with additional openings on the electronic device. Pins 132 may interface with the openings of the attachment portion and the additional openings on the electronic device to secure or attach the cable harness 100 to the electronic device.

Figure 4:
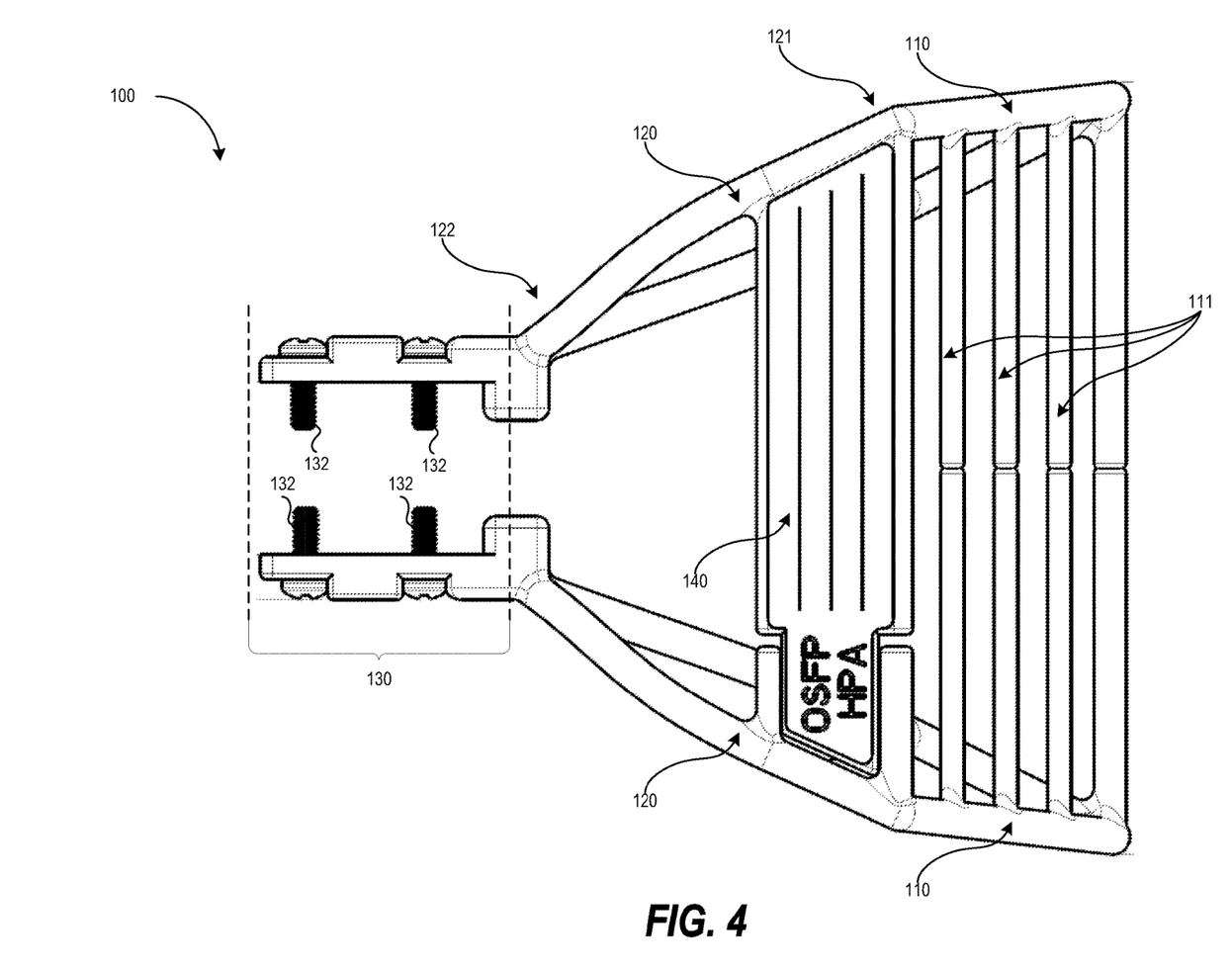
FIG. 4 illustrates a top view of a cable harness in accordance with one or more embodiments of the present disclosure.

FIG. 4 illustrates a top view of a cable harness in accordance with one or more embodiments of the present disclosure. The cable harness 100 includes a support frame 110, a tapered frame 120, and an attachment portion 130. The support frame 110 is coupled to the tapered frame 120. The tapered frame 120 is coupled to the attachment portion 130.

In one embodiment, the support frame 110 may support a plurality of cables of a network device. In one embodiment, the support frame 110 may include a set of horizontal dividers 111. The horizontal dividers may divide and/or support the plurality of cables into different sets or groups of cables, as discussed above. The dividers 111 and the support frame 110 may form four levels for the cables, as discussed above. The tapered frame 120 includes a first end 121 and a second end 122, as discussed above. The tapered frame 120 may be used to direct the cables to the support frame 110. The tapered frame 120 also includes support beams (not illustrated in FIG. 4) which may keep the cables within the tapered frame 120 and may also help the tapered frame 120 maintain its shape. The tapered frame 120 may also help spread out the plurality of cables over a larger horizontal area/dimension. The tapered frame 120 may also form or provide an intermediate open volume, space, region, etc. Portions of the cables may be located in the intermediate open volume, as illustrated in FIGS. 7 and 8.

The attachment portion 130 may be configured to attach the cable harness 100 to the electronic device (not illustrated in FIG. 4), as discussed above. The attachment portion 130 may include openings (not illustrated in FIG. 4). The openings may align with additional openings on the electronic device. Pins 132 may interface with the openings and the additional openings on the electronic device. To secure or attach the cable harness 100 to the electronic device.

Figure 5A:
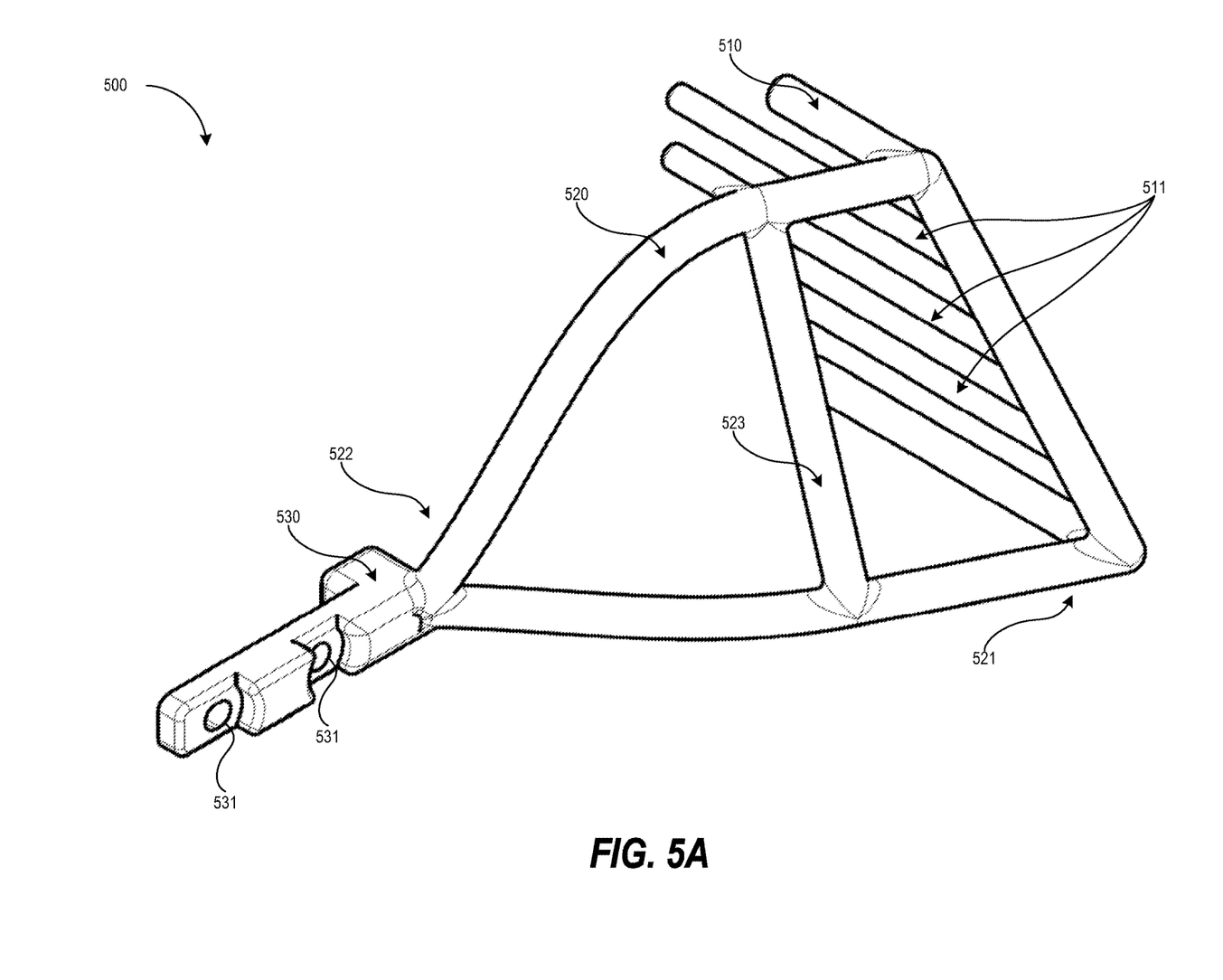
FIG. 5A illustrates a perspective view of a portion of a cable harness in accordance with one or more embodiments of the present disclosure.

FIG. 5A illustrates a perspective view of a portion 500 of a cable harness (e.g., cable harness 100 illustrated in FIG.

1-4) in accordance with one or more embodiments of the present disclosure. The portion 500 includes a portion of a support frame 510, a portion of a tapered frame 520, and a portion of an attachment portion 530. The portion of the support frame 510 includes portions of horizontal dividers 511. The portion of the tapered frame 520 includes a first end 521 and a second end 522, as discussed above. The portion of the tapered frame 520 also includes a support beam 523. The portion of the attachment portion 530 may be configured to attach the cable harness to an electronic device (not illustrated in FIG. 5A), as discussed above. The portion of the attachment portion 530 may include openings 531. The openings 531 may align with additional openings on the electronic device.

In one embodiment, the portion 500 may be a combined with another portion (e.g., portion 600 illustrated in FIGS. 6A through 6B) to form the cable harness. For example, the portion of the support frame 510 and/or the portions of horizontal dividers 511 may be hallow, or partially hollow (e.g., the ends may be hollow). This may allow the other portion to be inserted into the hallow parts of the portion of the support frame 510 and/or the portions of horizontal dividers 511.

Figure 5B:
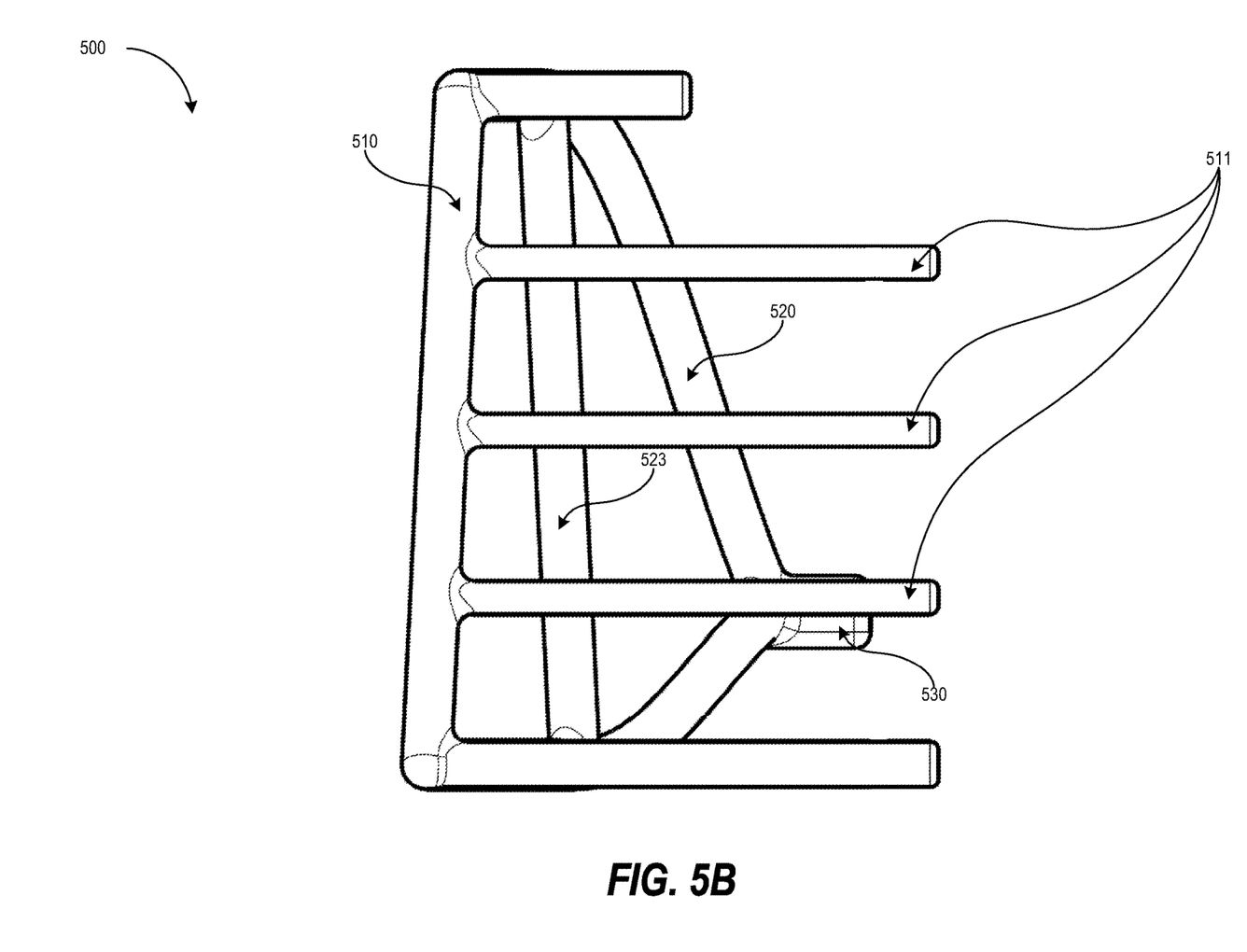
FIG. 5B illustrates a front view of a portion of a cable harness in accordance with one or more embodiments of the present disclosure.

FIG. 5B illustrates a front view of a portion 500 of a cable harness (e.g., cable harness 100 illustrated in FIG. 1-4) in accordance with one or more embodiments of the present disclosure. The portion 500 includes a portion of a support frame 510, a portion of a tapered frame 520, and a portion of an attachment portion 530. The portion of the support frame 510 includes portions of horizontal dividers 511. The portion of the tapered frame 520 includes a first end and a second end (not illustrated in FIG. 5B), as discussed above. The portion of the tapered frame 520 also includes a support beam 523. The portion of the attachment portion 530 may be configured to attach the cable harness to an electronic device (not illustrated in FIG. 5B), as discussed above. The portion of the attachment portion 530 may include openings (not illustrated in FIG. 5B). The openings may align with additional openings on the electronic device. In one embodiment, the portion 500 may be a combined with another portion (e.g., portion 600 illustrated in FIGS. 6A through 6B) to form the cable harness, as discussed above.

Figure 6A:
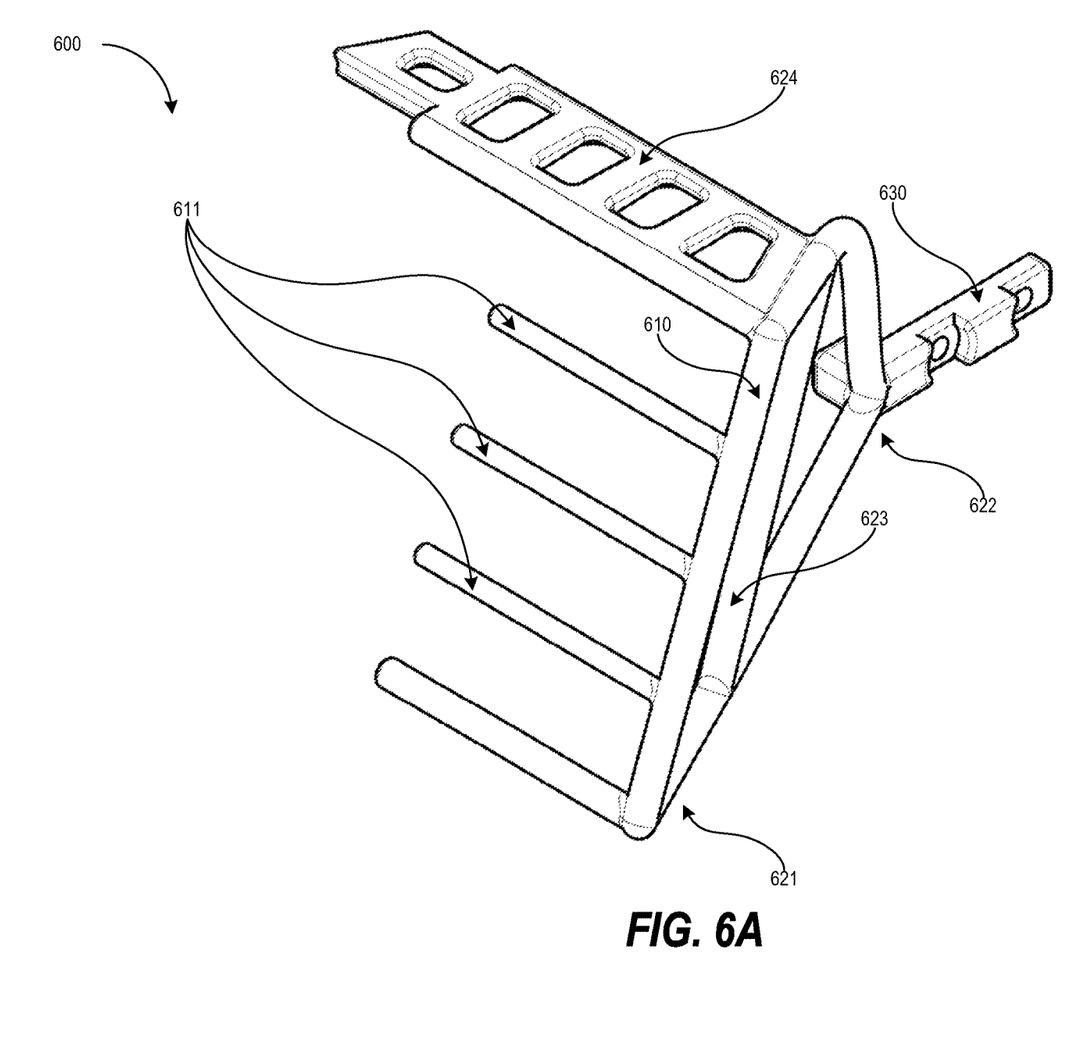
FIG. 6A illustrates a perspective view of a portion of a cable harness in accordance with one or more embodiments of the present disclosure.

FIG. 6A illustrates a perspective view of a portion 600 of a cable harness (e.g., cable harness 100 illustrated in FIG. 1-4) in accordance with one or more embodiments of the present disclosure. The portion 600 includes a portion of a support frame 610, a portion of a tapered frame 620, and a portion of an attachment portion 630. The portion of the support frame 610 includes portions of horizontal dividers 611. The portion of the tapered frame 620 includes a first end 621 and a second end 622, as discussed above. The portion of the tapered frame 620 also includes a support beam 623. The portion of the tapered frame 620 may further include a surface 624. The surface 624 may allow a labeling component (not illustrated in FIG. 6A) to be coupled to the tapered frame 620. For example, the labeling component may include tabs, indents, rails, grooves, etc., that may interface with the portion of surface 624 (e.g., the holes in the surface 624). The portion of the attachment portion 630 may be configured to attach the cable harness to an electronic device (not illustrated in FIG. 6A), as discussed above. The portion of the attachment portion 630 may include openings 631. The openings 631 may align with additional openings on the electronic device.

In one embodiment, the portion 600 may be a combined with another portion (e.g., portion 600 illustrated in FIGS. 5A through 5B) to form the cable harness. For example, the portion of the support frame 610 and/or the portions of horizontal dividers 611 may be hallow, or partially hollow (e.g., the ends may be hollow). This may allow the other portion to be inserted into the hallow parts of the portion of the support frame 610 and/or the portions of horizontal dividers 611.

Figure 6B:
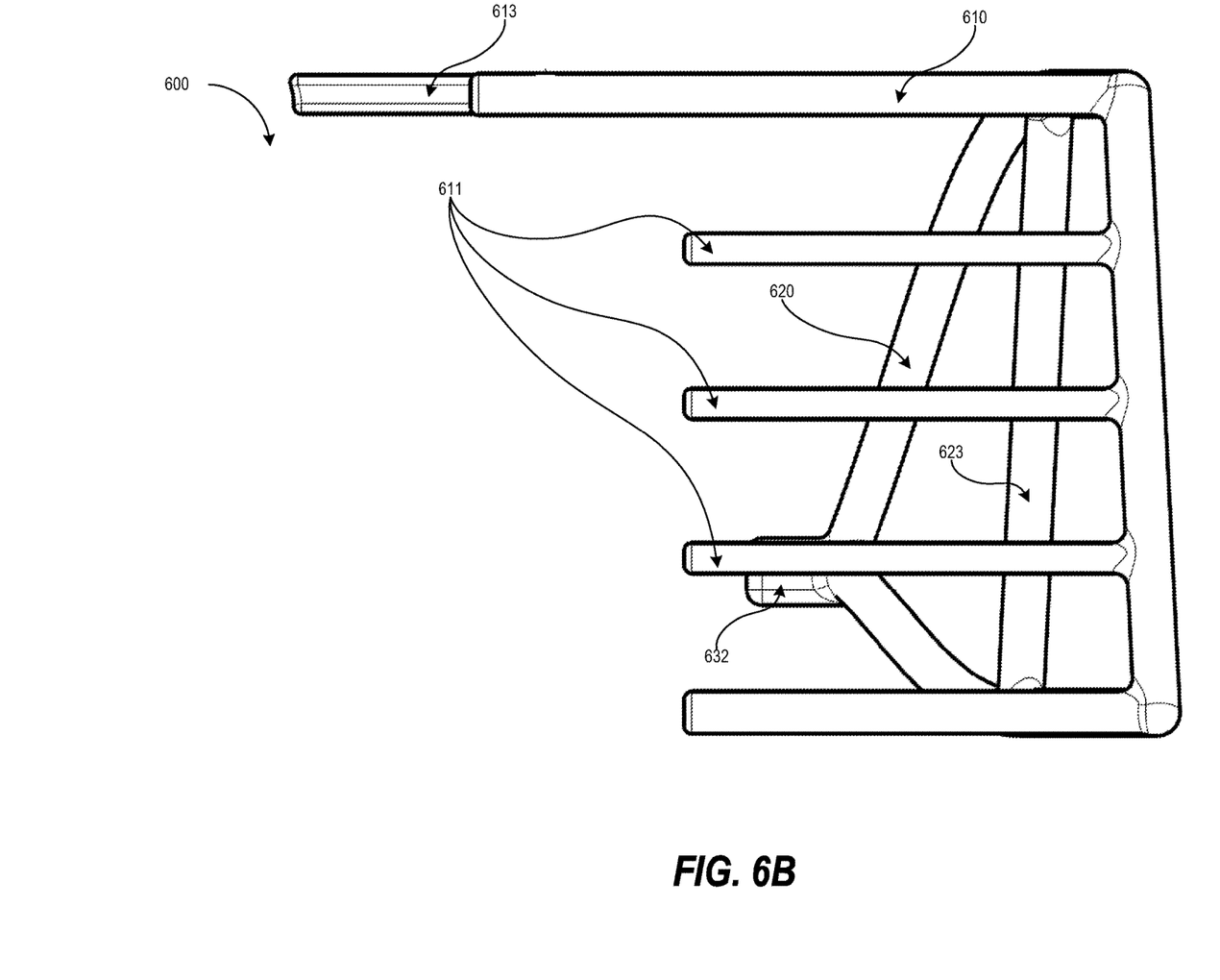
FIG. 6B illustrates a front view of a portion of a cable harness in accordance with one or more embodiments of the present disclosure.

FIG. 6B illustrates a front view of a portion 600 of a cable harness (e.g., cable harness 100 illustrated in FIG. 1-4) in accordance with one or more embodiments of the present disclosure. The portion 600 includes a portion of a support frame 610, a portion of a tapered frame 620, and a portion of an attachment portion 630. The portion of the support frame 610 includes portions of horizontal dividers 611. The portion of the tapered frame 620 includes a first end and a second end (not illustrated in FIG. 6B), as discussed above. The portion of the tapered frame 620 also includes a support beam 623. The portion of the attachment portion 630 may be configured to attach the cable harness to an electronic device (not illustrated in FIG. 6B), as discussed above. The portion of the attachment portion 630 may include openings (not illustrated in FIG. 6B). The openings may align with additional openings on the electronic device.

In one embodiment, the portion 600 may be a combined with another portion (e.g., portion 600 illustrated in FIGS. 5A through 5B) to form the cable harness. For example, referring to FIG. 5B, the portion 500 may be pushed left towards the 600 such that the protrusion 613 is inserted into the hollow portion of the portion of the support frame 510 (illustrated in FIGS. 5A through 5B). The portion of the dividers 600 and the portion of the dividers 500 may be aligned with each other. In other embodiments, some of the portions of the dividers 500 and 600 may also have protrusions which may be inserted into respective hollow portions. For example some of the portion of the dividers 500 may have hollow portions and some of the portion of the dividers 600 may have protrusions that may be inserted into those hollow portions. After the protrusion 613 is fully inserted into the hollow portion, the cable harness is assembled.

FIG. 7 illustrates a perspective view of a cable harness 100 and an electronic device 700 in accordance with one or more embodiments of the present disclosure. The cable harness 100 includes a support frame 110, a tapered frame 120, an attachment portion 130, and a labeling component 140. The support frame 110 is coupled to the tapered frame 120. The tapered frame 120 is coupled to the attachment portion 130. The cable harness 100 is coupled to electronic device 700 via the attachment portion 130 and pins 132. As discussed above, the electronic device 700 may be a network module, such as an OSFP module, a fiber optic network module, etc. Cables 710 may be coupled to or may originate from the electronic device 700.

In one embodiment, the support frame 110 may support cables 710 of the network device 700. In one embodiment, the support frame 110 may include a set of horizontal dividers 111. The horizontal dividers 111 may divide and/or support the plurality of cables into different sets or groups of cables. For example, the cables 710 may be divided into four groups of cables, as illustrated in FIG. 7. The tapered frame 120 includes a first end 121 and a second end 122, as discussed above. The tapered frame 120 may be used to direct the cables 710 to the support frame 110. The tapered frame 120 also includes support beams 123 which may keep the cables 710 within the tapered frame 120 and may also help the tapered frame 120 maintain its shape. The tapered frame 120 may also help spread out the plurality of cables over a larger horizontal area/dimension.

The attachment portion 130 may be configured to attach the cable harness 100 to the electronic device 700, as discussed above. The attachment portion 130 may include openings (not illustrated in FIG. 7). The openings may align with additional openings on the electronic device. Pins 132 (e.g., screws) may interface with the openings of the attachment portion 130 and the additional openings on the electronic device to secure or attach the cable harness 100 to the electronic device.

FIG. 8 illustrates a side view of a cable harness and an electronic device in accordance with one or more embodiments of the present disclosure. The cable harness 100 includes a support frame 110, a tapered frame 120, an attachment portion 130, and a labeling component 140. The support frame 110 is coupled to the tapered frame 120. The tapered frame 120 is coupled to the attachment portion 130. The cable harness 100 is coupled to electronic device 700 via the attachment portion 130 and pins 132. Cables 710 may be coupled to or may originate from the electronic device 700.

The support frame 110 may support cables 710 of the network device 700. In one embodiment, the support frame 110 may include a set of horizontal dividers (not illustrated in FIG. 8). The horizontal dividers may divide and/or support the cables 710 into different sets or groups of cables, as discussed above. The tapered frame 120 includes a first end 121 and a second end 122, as discussed above. The tapered frame 120 may be used to direct the cables 710 to the support frame 110. The tapered frame 120 also includes support beams 123 which may keep the cables 710 within the tapered frame 120 and may also help the tapered frame 120 maintain its shape. The tapered frame 120 may also help spread out the plurality of cables over a larger horizontal area/dimension. The tapered frame 120 may also form or provide an intermediate open volume, space, region, etc. Portions of the cables may be located in the intermediate open volume, as illustrated in FIGS. 7 and 8.

The attachment portion 130 may be configured to attach the cable harness 100 to the electronic device 700, as discussed above. The attachment portion 130 may include openings (not illustrated in FIG. 8). The openings may align with additional openings on the electronic device. Pins 132 may interface with the openings of the attachment portion 130 and the additional openings on the electronic device to secure or attach the cable harness 100 to the electronic device.

In one embodiment, the attachment portion 130 is substantially level with the top of the electronic device 700. For example, as illustrated in FIG. 8, the top of the attachment portion 130 is the same height as the height of the electronic device 700 when the cable harness 100 is attached to the electronic device 700. The bottom of the cable harness 100 may be substantially level with the bottom of the electronic device 700. This may allow the electronic device 700 and the cable harness 100 to be laid flat on a surface (e.g., on a table). The locations of the different parts of the cable harness relative to the electronic device may change in other embodiments. For example, the attachment portion 130 may be positioned higher or lower relative to the electronic device 700.

The examples, implementations, embodiments, etc., of the cable harnesses and/or portions of cable harnesses may be manufactured using various types of materials. For example, a more easily deformable material such as rubber, silicon, etc., may be used to manufacture a cable harness. In another, a less easily deformable material such as plastics, thermoplastics, polymers, etc., may be used to manufacture a cable harness. In a further example, a harder material such as metal, alloys, etc., may be used to manufacture a cable harness. In other examples, multiple types of materials may be used to manufacture a cable harness. For example, the cable harness may be made of plastic with a rubber or silicone coating. Furthermore, the shapes, sizes, and configuration of the cable harnesses described herein are merely examples. Different shapes, sizes, layouts, configurations, etc., for the cable harness may be used in other embodiments.

Figure 9:
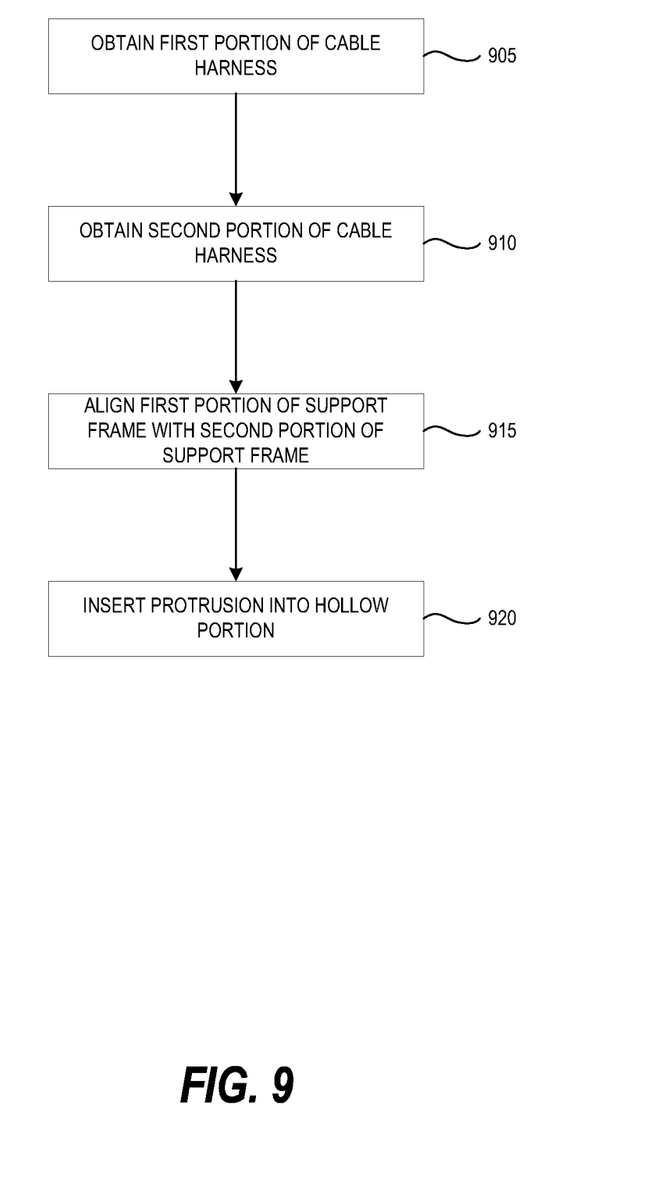
FIG. 9 is a flow diagram of a method of assembling a cable harness in accordance with one or more embodiments of the present disclosure.

FIG. 9 is a flow diagram of a method 900 of assembling a cable harness in accordance with one or more embodiments of the present disclosure. It should be appreciated that the blocks of the method 900 in FIG. 9 can be performed in differing orders, groupings, or subsets than shown in FIG. 9, for various purposes or user preferences. At block 905, a first portion of a cable harness is obtained. For example, the portion 500 illustrated in FIG. 5 may be obtained. As discussed above, the first portion of the cable harness may include a first portion of a support frame, a first portion of a tapered frame of an attachment portion. At block 910, a second portion of a cable harness is obtained. For example, the portion 600 illustrated in FIG. 6 may be obtained. As discussed above, the second portion of the cable harness may include a second portion of a support frame, a second portion of a tapered frame of an attachment portion. At block 915, the first portion of the support frame may be aligned with the second portion of the support frame. For example, the portions of the dividers in the portions of the support frames may be aligned with each other. In another example one or more protrusions in the first portion of the support frame may be aligned with one or more hollow portions in the second portion of the support frame. The one or more protrusions in the first portion of the support frame may be inserted into one or more hollow portions in the second portion of the support frame at bloc 920.

Figure 10:
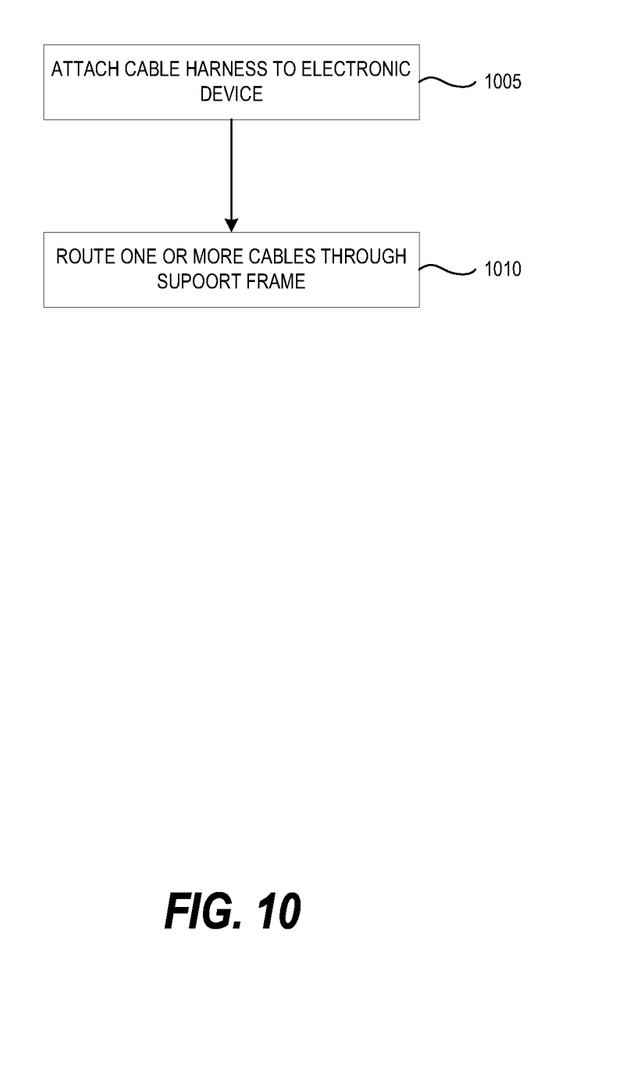
FIG. 10 is a flow diagram of a method of using a cable harness in accordance with one or more embodiments of the present disclosure.

FIG. 10 is a flow diagram of a method of using a cable harness in accordance with one or more embodiments of the present disclosure. It should be appreciated that the blocks of the method 1000 in FIG. 10 can be performed in differing orders, groupings, or subsets than shown in FIG. 10, for various purposes or user preferences. At block 1005, a cable harness (e.g., cable harness 100 illustrated in FIGS. 1-4, 8, and 9) is attached to an electronic device comprising a plurality of cables. As discussed above, the cable harness includes a support frame configured to support a plurality of cables coupled to an electronic device, a tapered frame coupled to the support frame, and an attachment portion coupled to the tapered frame. The attachment portion is configured to attach the cable harness to the electronic device. For example, the attachment portion may include openings that may align with openings on the electronic device, as discussed above. Pins (e.g., screws) inserted into the openings on the attachment portion and the electronic device to secure or attach the cable harness to the electronic device. At block 1010, the cables of the electronic device may be routed through the support frame or positioned within the support frame. For example, the cables may be placed at different levels (which may be defined using dividers) of the support frame, as discussed above.

It should be understood that although the terms first, second, etc. may be used herein to describe various_steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. In addition, the term "set" includes one or more items within the set. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

A module, an application, a layer, an agent or other method-operable entity could be implemented as hardware, firmware, or a processor executing software, or combinations thereof. It should be appreciated that, where a software-based embodiment is disclosed herein, the software can be embodied in a physical machine such as a controller. For example, a controller could include a first module and a second module. A controller could be configured to perform various actions, e.g., of a method, an application, a layer or an agent.

The embodiments can also be embodied as computer readable code on a tangible non-transitory computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including hand-held devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Various units, circuits, or other components may be described or claimed as "configured to" perform a task or tasks. In such contexts, the phrase "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. An apparatus, comprising:
a support frame configured to support a plurality of cables coupled to an electronic device;
a tapered frame comprising a first end and a second end, wherein the second end is smaller than the first end, wherein the first end is coupled to the support frame and wherein the tapered frame is tapered in two-dimensions between the first end and the second end; and
an attachment portion coupled to the tapered frame at the second end, wherein the attachment portion is configured to attach the apparatus to the electronic device and wherein the attachment portion includes a first set of openings configured to align with a second set of openings on the electronic device.

2. The apparatus of claim 1, wherein the support frame comprises a set of dividers.

3. The apparatus of claim 2, where the set of dividers are oriented horizontally, vertically, or diagonally.

4. The apparatus of claim 1, wherein the tapered frame provides an intermediate open volume to direct the cables from the electronic device to the support frame.

5. The apparatus of claim 1, wherein the tapered frame is configured to spread out the plurality of cables.

6. The apparatus of claim 1, wherein the tapered frame is configured to reduce tangling of the plurality of cables.

7. The apparatus of 1, wherein:
the first set of openings is further configured to receive a set of pins; and
the set of pins is configured to interface with the first set of openings and the second set of openings to attach the apparatus to the electronic device.

8. The apparatus of claim 1, further comprising a labeling component configured to provide information about one or more of the plurality of cables or the electronic device, wherein the labelling component is coupled to one or more of the support frame or the tapered frame.

9. An apparatus, comprising:
a first portion of a cable harness, the first portion of the cable harness including a first portion of a support frame having a protrusion, a first portion of a tapered frame, and a first portion of an attachment portion, wherein the first portion of the tapered frame includes a first end coupled to the first portion of the support frame and includes a second end coupled to the first portion of the attachment portion, the second end smaller than the first end and the first portion of the support frame including a set of dividers configured to support cables; and
a second portion of the cable harness including a second portion of the support frame having a hollow portion, a second portion of the tapered frame, and a second portion of the attachment portion, wherein the protrusion of the first portion of the support frame is configured to be inserted into the hollow portion of the second portion of the support frame when the first portion of the support frame is aligned with the second portion of the support frame, and wherein the second portion of the tapered frame includes a first end coupled to the second portion of the support frame and includes a second end coupled to the second portion of the attachment portion, the second end smaller than the first end and the second portion of the support frame including a set of dividers configured to support the cables.

10. The apparatus of claim 9, wherein the dividers are oriented horizontally, vertically, or diagonally.

11. The apparatus of claim 9, wherein the tapered frame provides an intermediate open volume to direct the cables from an electronic device at the attachment portion to the support frame.

12. The apparatus of claim 9, wherein the tapered frame is configured to spread out the plurality of cables.

13. The apparatus of claim 9, wherein the tapered frame is configured to reduce tangling of the plurality of cables.

14. The apparatus of claim 9, wherein the attachment portion is configured to attach the cable harness to an electronic device, and wherein the attachment portion comprises a first set of openings configured to align with a second set of openings on the electronic device.

15. The apparatus of claim 14, wherein:
the first set of openings is further configured to receive a set of pins; and
the set of pins is configured to interface with the first set of openings and the second set of openings to attach the apparatus to the electronic device.

16. The apparatus of claim 9, further comprising a labeling component configured to provide information about one or more of the plurality of cables or the electronic device, wherein the labelling component is coupled to one or more of the support frame or the tapered frame.

17. A method, comprising:
obtaining a first portion of a cable harness, the first portion of the cable harness comprising a first portion of a support frame, a first portion of a tapered frame, and a first portion of an attachment portion;
obtaining a second portion of a cable harness, the second portion of the cable harness comprising a second portion of the support frame, a second portion of the tapered frame, and a second portion of the attachment portion;
aligning the first portion of the support frame with the second portion of the support frame; and
inserting a protrusion of the first portion of the support frame into a hollow portion of the second portion of the support frame.

18. The method of claim 17, further comprising:
routing one or more cables of the plurality of cables through the support frame of the cable harness.

* * * * *